(12) United States Patent
Chen et al.

(10) Patent No.: US 8,835,942 B2
(45) Date of Patent: Sep. 16, 2014

(54) LED MODULE

(75) Inventors: Chen-Yu Chen, Taipei (TW); Yu-Kang Lu, Taipei (TW); Yan-Yu Wang, Taipei (TW)

(73) Assignees: Lite-On Electronics (Guangzhou) Limited, Guangzhou (CN); Lite-On Technology Corp., Taipei (TW)

( * ) Notice: Subject to any disclaimer, the term of this patent is extended or adjusted under 35 U.S.C. 154(b) by 468 days.

(21) Appl. No.: 13/032,755

(22) Filed: Feb. 23, 2011

(65) Prior Publication Data
US 2011/0210346 A1 Sep. 1, 2011

(30) Foreign Application Priority Data

Feb. 26, 2010 (CN) .......................... 2010 1 0123506

(51) Int. Cl.
*H01L 33/08* (2010.01)
*F21K 99/00* (2010.01)
*H01L 33/48* (2010.01)
*F21Y 105/00* (2006.01)
*F21Y 101/02* (2006.01)
*H01L 33/62* (2010.01)

(52) U.S. Cl.
CPC ................. *F21K 9/90* (2013.01); *H01L 33/486* (2013.01); *F21Y 2105/001* (2013.01); *F21Y 2101/02* (2013.01); *H01L 2224/48091* (2013.01); *H01L 33/62* (2013.01)

USPC .............. 257/88; 257/98; 257/100; 257/433; 257/666; 257/E33.005

(58) Field of Classification Search
CPC .......... H01L 2224/48247; H01L 2224/49113; H01L 33/486; H01L 33/505; H01L 33/508
USPC .............. 257/88, 98, 100, 666, 784, E25.032, 257/E33.005
See application file for complete search history.

(56) References Cited

U.S. PATENT DOCUMENTS

2004/0252501 A1* 12/2004 Moriyama et al. ............ 362/238

FOREIGN PATENT DOCUMENTS

TW 200921584 A 5/2009

* cited by examiner

*Primary Examiner* — Lynne Gurley
*Assistant Examiner* — Vernon P Webb
(74) *Attorney, Agent, or Firm* — Rosenberg, Klein & Lee

(57) ABSTRACT

An LED module includes at least two LED package units and at least one connecting unit. Each LED package unit includes at least one first engaging portion, at least one first conductive portion, and at least one LED chip connected electrically to the first engaging portion. The connecting unit includes at least two second engaging portions, and at least one second conductive portion having two opposite end sections extending respectively to the second engaging portions. When the second engaging portions of the connecting unit engaged with the first engaging portions of the LED package units, respectively, the end sections of the second conductive portion contact electrically and respectively the corresponding first conductive portions so as to connect electrically the LED chips of the LED package units.

9 Claims, 13 Drawing Sheets

LED MODULE

CROSS-REFERENCE TO RELATED APPLICATION

This application claims priority of Chinese Application No. 201010123506.3, filed on Feb. 26, 2010.

BACKGROUND OF THE INVENTION

1. Field of the Invention

This invention relates to an LED (light-emitting diode) module, more particularly to an LED module having a plurality of LED package units that can be interconnected to form a large size illuminating light source.

2. Description of the Related Art

When it is desired to form an area light source using LEDs, a plurality of LED chips may be arranged in an array on a circuit board, such as in the light emitting diode light source model disclosed in U.S. Patent Publication No. 20060255352. However, a drawback of this method is that when dimensions of lighting areas are different, it is necessary to prepare different dimensions of customized circuit boards to accommodate mounting the LED chips thereto. Hence, an insufficient amount of flexibility is provided with respect to varying the dimensions of an area light source.

SUMMARY OF THE INVENTION

Therefore, the object of the present invention is to provide an LED module having a plurality of LED package units that can be connected to form a light source with variable scale.

Thus, a connecting unit connects any two LED units to form an LED module of the present invention. Each LED package unit is formed with a first engaging portion, a first conductive portion forming on said first engaging portion, and a LED chip positioned on thereof and connected electrically to the first engaging portion. The connecting unit is formed with two second engaging portions, and second conductive portion having two opposite sections extending respectively to the second engaging portions. The second engaging portions of the connecting unit engage with the first engaging portions of the LED package units, respectively. Thus, the two end sections of the second conductive portion of the connecting unit contact respectively the corresponding first conductive portions of the LED package units so as to connect electrically the corresponding LED chips of the LED package units.

An efficiency of the present invention resides in that, in addition to achieving the structural mosaicking of the LED package units using the connecting units to permit the user to assemble a light source of different dimensions according to his/her requirements, the LED chips of the LED package units can also be coupled electrically to each other through the connecting units.

BRIEF DESCRIPTION OF THE DRAWINGS

Other features and advantages of the present invention will become apparent in the following detailed description of the preferred embodiments of the invention, with reference to the accompanying drawing, in which.

DETAILED DESCRIPTION OF THE PREFERRED EMBODIMENTS

Figure 1:
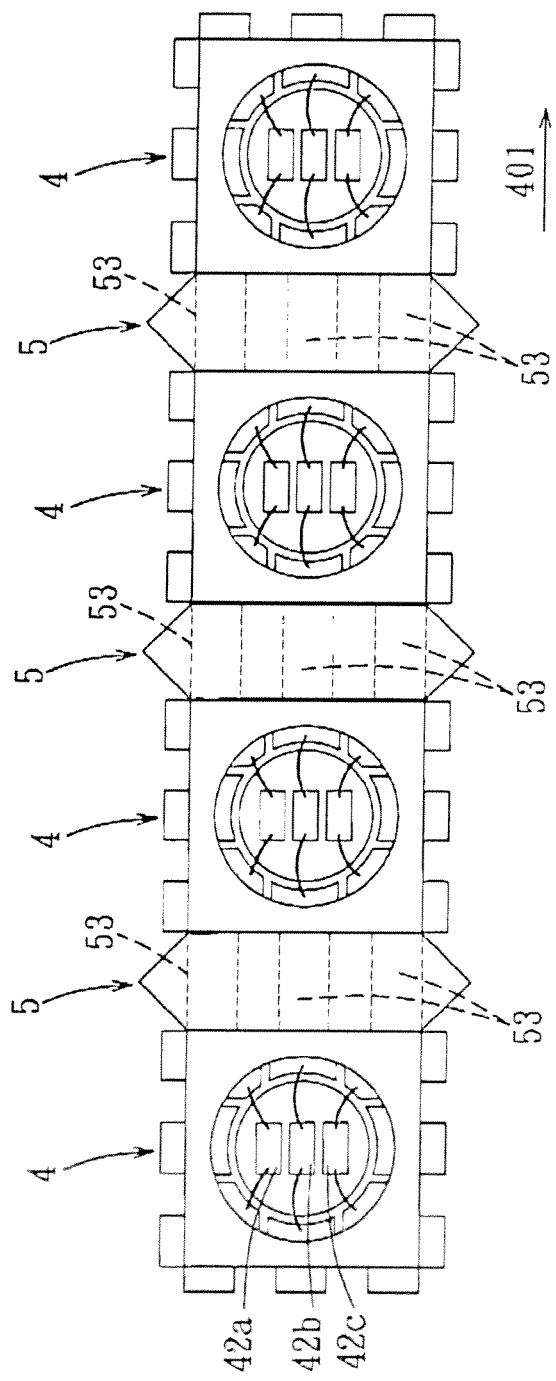
FIG. 1 is a schematic top view of a portion of components of an LED module according to the first preferred embodiment of the present invention.
Figure 2:
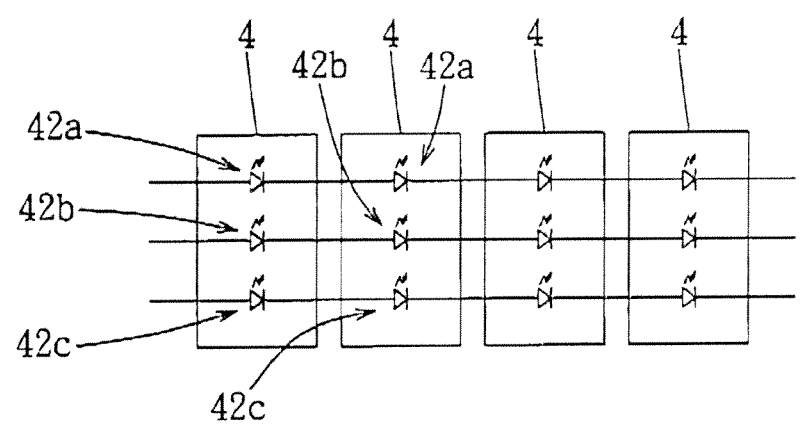
FIG. 2 is a circuit diagram of FIG. 1.

The above-mentioned and other technical contents, features, and effects of this invention will be clearly presented from the following detailed description of two preferred embodiments in cooperation with the reference drawings.

Before this invention is described in detail, it should be noted that, in the following description, similar elements are designated by the same reference numerals.

Referring to FIGS. 1 to 14, en LED module of the present invention includes a plurality of LED package units and a plurality of connecting units engaged thereof.

The connecting unit may be configured as a first connecting component 5, as shown in FIG. 1, connecting any two adjacent LED package units 4 along a first direction 401 and connected electrically to each other. The LED chips (42a, 42b, 42c) of one of the LED package units 4 that is disposed on one side of the first connecting component and the LE chips (42a, 42b, 42c) of another LED package unit 4 that is disposed on the other side of the first connecting component 5 are connected electrically and respectively to each other in series. Further, the series-connected LED chips (42a), the series-connected LED chips (42b), and the series-connected LED chips (42c) are preferably arranged in parallel, especially when the series-connected LED chips (42a, 42b, 42c) are different colors. When the color of the LED chip (42a) is emitting green light, the series of the plurality of the LED chips (42a) of the plurality of the LED package units is as a green light bar source.

Figure 3:
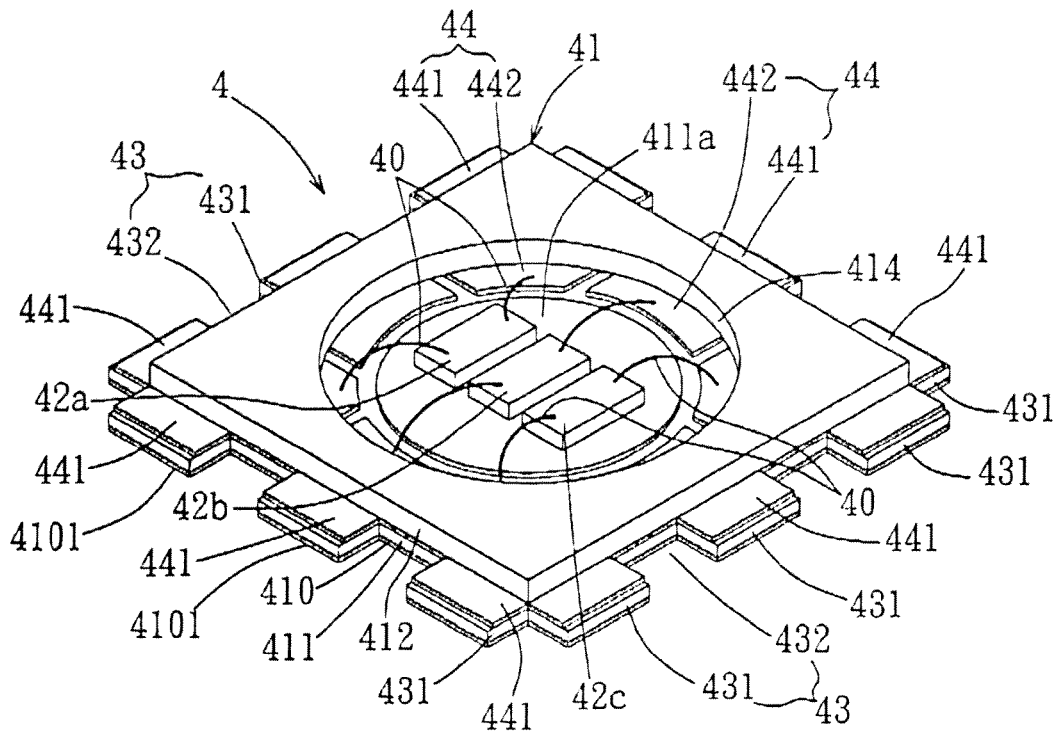
FIG. 3 is a perspective view of an LED package unit of the first preferred embodiment.

With reference to FIG. 3, each LED package unit 4 includes a submount 41, a plurality of first engaging portions 43 coupled to the submount 41, a plurality of first conductive portions 44 extending from the submount 41 to the first engaging portions 43, and a plurality of LED chips (42a, 42b, 42c) positioned on the submount 41, electrically isolated from each other, and connected to the corresponding first engaging portions 43.

In this embodiment, the submount 41 is a multi-layered structure formed with a bottom layer 411 and a top layer 412. A top surface of the bottom layer 411 is provided with a chip-mounting (411a). The LED chips (42a, 42b, 42c) are fixed to the chip-mounting area (411a).

In addition, a heat-dissipating formed on a bottom face of the bottom layer 411 to increase the heat-dissipating capability of the LED package unit 4. Moreover, the bottom layer 411 may have a groove or a through hole (not shown) within thereof to intercommunicate the heat-dissipating layer 410 and the chip-mounting area (411a), thereby further enhancing the effect of heat dissipation. The chip-mounting area (411a) and the heat-dissipating layer 410 may be made of the same metal material or different metal materials. Preferably, the metal material is copper or gold.

In this embodiment, the shape of the submount 41 may be a polygonal shape, such as a rectangular shape. Preferably, the shape of the submount 41 is square. Further, the shape of the bottom layer 411 and the top layer 412 are similar and square-like due to easier engaged process.

The first engaging portions 43 are configured as protrusions 431 that project outwardly from and that are spaced apart from each other along peripheral sides of the submount 41. Furthermore, the first engaging portions 43 on the respective lateral side may be configured as spaced-apart protrusions that project outwardly and selectively from one only or a combination of at least two of the top layer 412, the first conductive portions 44, the bottom layer 411 and the 410.

Each two adjacent ones of toe protrusions 421 and a corresponding lateral side of the submount 41 cooperatively define a groove 432 thereamong. The groove 432 preferably has a shape complementing that of the protrusion 431 in this embodiment. Each two adjacent ones of the protrusions 431 and a corresponding lateral side of the submount 41 cooperatively define a groove 432 thereamong. The groove 432 preferably has a shape complementing that of the protrusion 431 in this embodiment. Hence, a continuous groove-and-protrusion structure composed of the grooves 432 and the protrusions 431 is provided on a respective lateral side of the submount 41. Stated differently, two adjacent protrusions 431 at each corner of the bottom layer 411 have an included angle of 90° therebetween to facilitate connection with other elements. The protrusions 431 on each two opposite lateral sides of the submount 41 are aligned respectively to each other. That is, the groove-and-protrusion structure on one lateral side of the submount 41 is aligned with the groove-and-protrusion structure on the other opposite lateral side of the submount 41. Hence, each lateral side of the submount 41 or the LED package unit 4 has a similar groove-and-protrusion structure.

In addition, the bottom layer 411 is made of an insulating material, preferably a high heat-dissipating material having a heat-dissipating coefficient of more than 10 W/m*K, such as silicon or a ceramic material.

The submount 41 has a cavity 414 which is an opening of the top layer 412 for containing LED chips and exposure of the LED chips (42a, 42b, 42c) that are fixed on the chip-mounting area (411a). That is, the cavity 414 provides a light exit ea for dispersion of light emitted by the LED chips (42a, 42b, 42c). Generally, a transparent encapsulating material (not shown), such as silicone or epoxy resin, is filled in the cavity 414 to cover the LED chips (42a, 42b, 42c), or an optical engine structure (i.e., a lens made of epoxy resin or may further be formed on the above-mentioned structure. Further, each or of the encapsulating material and the optical engine structure may include a wavelength converting medium, such as phosphor powder, so as to provide a desired particular color of light, for example, white light.

The first conductive portions 44 are configured as conductive pads that are spaced apart from each other and that surround the chip-mounting area (411a). The first conductive portions 44 are provided on the top surface of the bottom layer 411. Each first conductive portion 44 has at least one end section 441 extending to a top surface of a respective first engaging portion 43, and another end section 442 extending toward the chip-mounting area (411a) and exposed via the cavity 414 so as to form a conductive layer. In this embodiment, four of the first conductive portions 44 located respectively on the four corners of the bottom layer 411, and each has two end sections 441 extending respectively to the two adjacent first engaging portions 43 that are located at the corresponding corner of the bottom layer 411. The first conductive portions 44 are formed of at least one conductive material, such as metal. The first conductive portions 44 and the chip-mounting area (411a) may be made of the same conductive material and may be defined and patterned simultaneously via same one photolithography process.

In this embodiment, the heat-dissipating layer 410 has a main section disposing under the bottom layer 411 and having a peripheral edge flush with the peripheral edge of the bottom layer 411, and a plurality of spaced-apart end sections 4101 projecting outwardly from the peripheral edge thereof, extending respectively to bottom surfaces of the first engaging portions 43, and flush with the first engaging portions 43, as best shown in FIG. 3. Hence, the cross-sections of the grooves 432 and the protrusions 431 of the first engaging portions 43 are multi-layered structures. In this embodiment, each protrusion 431 of the first engaging portions 43 is formed of the respective one end section 441 of the first conductive portion 44, the extension of the bottom layer 411, and the corresponding end section 4101 of the heat-dissipating layer 410.

Each of the LED chips (42a, 42b, 42c) is connected electrically to corresponding two of the first conductive portions 49 of the conductive layer. The electrical connection may be achieved using techniques or through conductive wires depending on the type of chips and the circuitry design. In this embodiment, each LED chip (42a, 42b, 42c) of the LED package unit 4 is connected electrically and selectively to one end section 442 of the first conductive portions 44 on a left side and a corresponding one end section 442 of the first conductive portions 44 on a right side through a pair of conductive wires 40. The LED chips (42a, 42b, 42c) are parallel to each other within one LED package unit, especially when the chips are multicolored.

Figure 4:
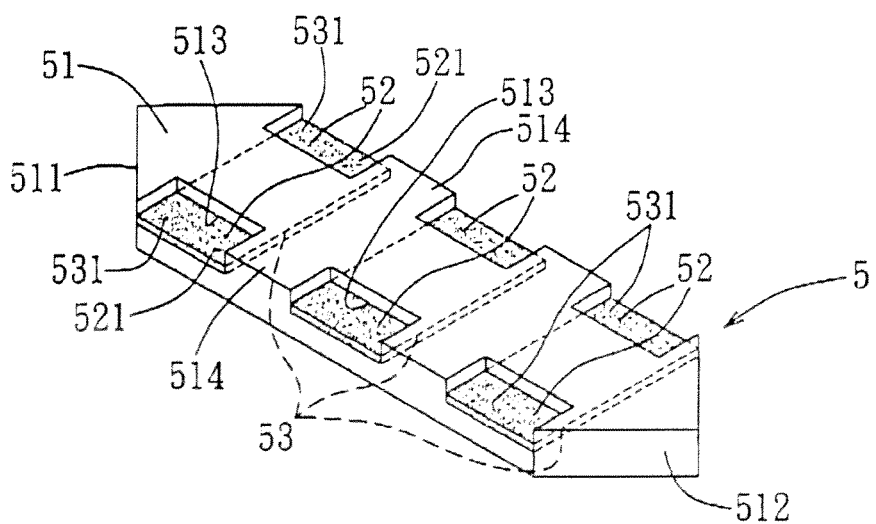
FIG. 4 is a bottom perspective view of a first connecting component of the first preferred embodiment.

Each connecting unit that is configured as the first connecting component 5, as shown in FIG. 4, includes a first main body 51, a plurality of pairs of aligning second engaging portions 52 provided on a bottom face of the first main body 51, and a plurality of second conductive portions 53 provided on and covered partially by the first main body 51. In this embodiment, the first main body 51 is configured as an elongated shape block having two opposite long sides, and two opposite short sides between the long sides. The pairs of second engaging portions 52 are provided on the long sides of the first main body 51. The short sides respectively include a first end 511, and a second end 512 having a structure similar to that of the first and 511. Each of the first and second ends 511, 512 is pointed, and has an obtuse angle that may range from 90-180° so as to facilitate subsequent positioning of the LED package units 4.

Each pair of the second engaging portions 52 are configured as grooves that extend inwardly and respectively from the long opposite lateral sides of the first main body 51. Each long side of the first main body 51 further has a plurality of protrusions 514 each disposed between two adjacent ones of the grooves 521. The grooves 521 are not only used for engagement, but also allow electrical contact between the second conductive portions 53 and respective first conductive portions 44.

The first main body 51 further has a plurality of passages 513 each intercommunicating a corresponding pair of the second engaging portions 52 and permitting extension of a respective second conductive portion 53 therethrough, such that two opposite end sections 531 of each second conductive portion 53 are exposed on the bottom face of the first main body 51 via a respective pair of the second engaging portions 52 having corresponding grooves. The second conductive portions 53 may be molding by the first main body 51, may be as a movable metal plate embedded in the first main body 51, or may be formed by stack sintering so as to form a one-piece body with the first main body 51. Moreover, the groove-and-protrusion structure at one lateral side of the LED package unit 4 and a groove-and-protrusion structure at one of the opposite lateral sides of the first main body 51 of the first connecting component 5 are complementary to each other.

Hence, the pairs of the second engaging portions 52 on the long sides of the first main body 51 of each first connecting component 5 can be engaged respectively to the first engaging portions 43 at one lateral side of one LED package unit 4 and the first engaging portions 43 at one lateral side of another LED package unit 4 since they are configured as interengageable structures that include complementarily shaped groove and protrusion, thereby interconnecting the two LED package units 4. Further, the protrusions 514 on the long sides of the first main body 51 can be inserted respectively into the grooves 432 of the two interconnected LED package units 4. A top face of the first main body 51 of each first connecting component 5 is flush with the top faces of the two interconnected LED package units 4. Therefore, a plurality of the LED package units 4 that are aligned along the first direction 401 can be interconnected through the first connecting components 5 to form a horizontal row, as best shown in FIG. 1. Simultaneously, the end sections 531 of each second conductive portion 53 of each first connecting component 5 are in electrical contact with the first conductive portions 44 of the two interconnected LED package units 4, which are connected electrically and respectively to at least one LED chip (42a, 42b, 42c) of the LED package units 4, so that said one LED chips (42a, 42b, 42c) of the LED package units 4 are connected in series. Hence, the LED module 400 (see FIG. 5) of the present invention can provide at least one series-connected LED chips (42a, 42b, 42c).

For example, two LED package units 4 interconnected by one first connecting component 5, each LED package unit 4 includes at least one LED chip (42a) connected electrically to an adjacent first conductive portion 44 through at least one conductive wire 40. The first conductive portion 44 of a first LED package unit 4 extends to a first engaging portion 43, and contacts electrically the end section 531 of the second conductive portion 53 at one long side of the first connecting component 5. The end section 531 of the second conductive portion 53 at the other long side of the first connecting component 5 contacts electrically the first conductive portion 44 of a second LED package unit 4. The LED chip (42a) of the second LED package unit 4 is connected electrically in series to the LED chip (42a) of the first LED package unit 4 through the aforesaid circuit structure.

The LED chips (42a, 42b, 42c) of the LED package units 4 can be connected electrically in series or in parallel depending upon the connecting position of the conductive wire 40 and the position of the first or second conductive portion 44, 53, and is not limited to the drawings of this embodiment.

Figure 5:
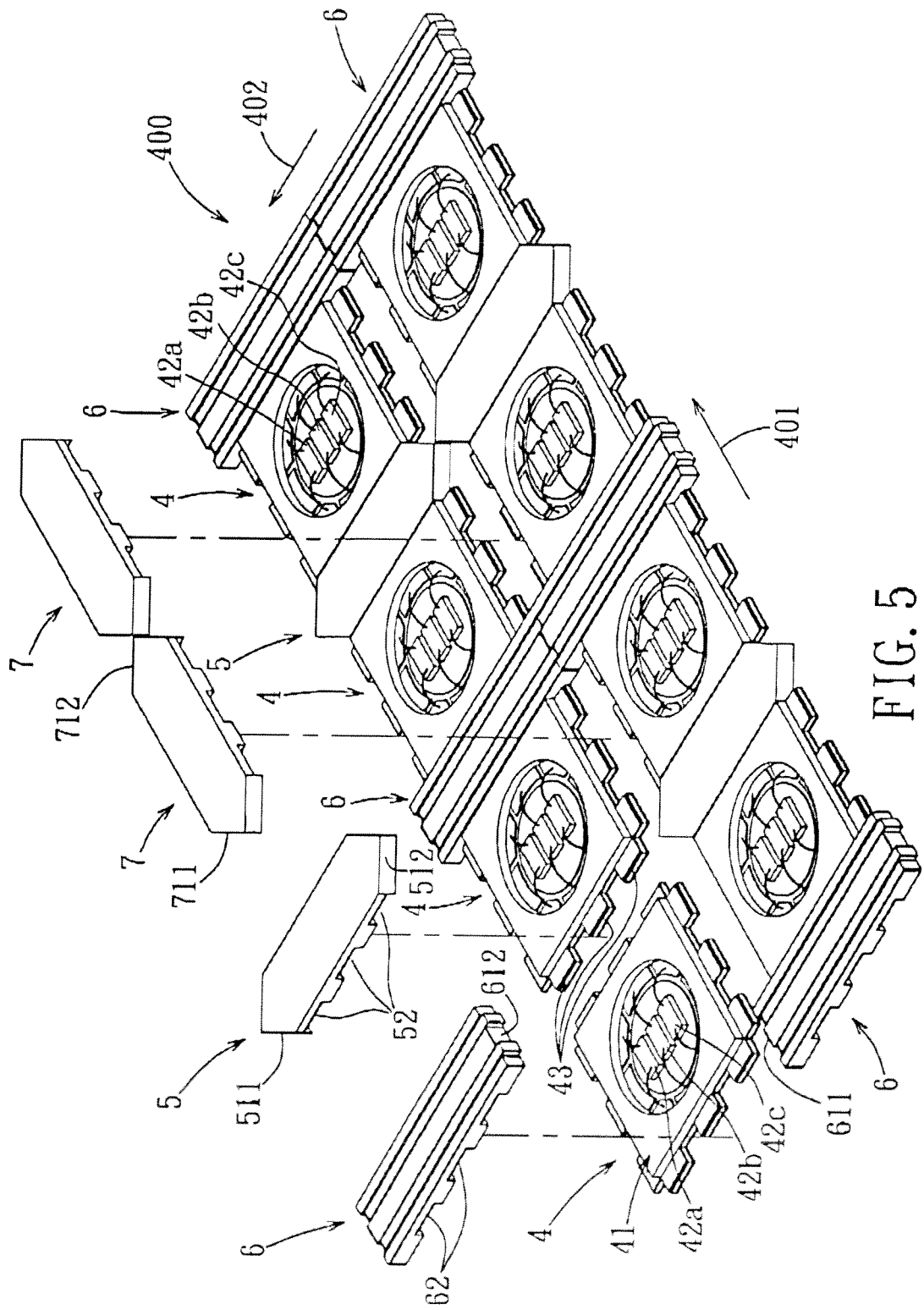
FIG. 5 is a perspective view of the first preferred embodiment, illustrating how a plurality of the LED package units are interconnected through a plurality of first and second connecting components to form an area light source.

Connecting unit may be further configured as a second connecting component 6, as shown in FIG. 5. The structure of the second connecting component 6 is similar to that of the first connecting component 5. The difference thereof resides in that the first main body 61 of the second connecting component 6 has opposite first and second connecting ends 611, 612 which have no pointed ends, but which include complementary structures. The second connecting components 6 not only can interconnect the LED package units 4 along the first direction 401, but also can interconnect the same along a second direction 402 that is transverse and perpendicular to the first direction 401, so that any two rows of the LED package units 4 can be connected electrically to each other.

Figure 6:
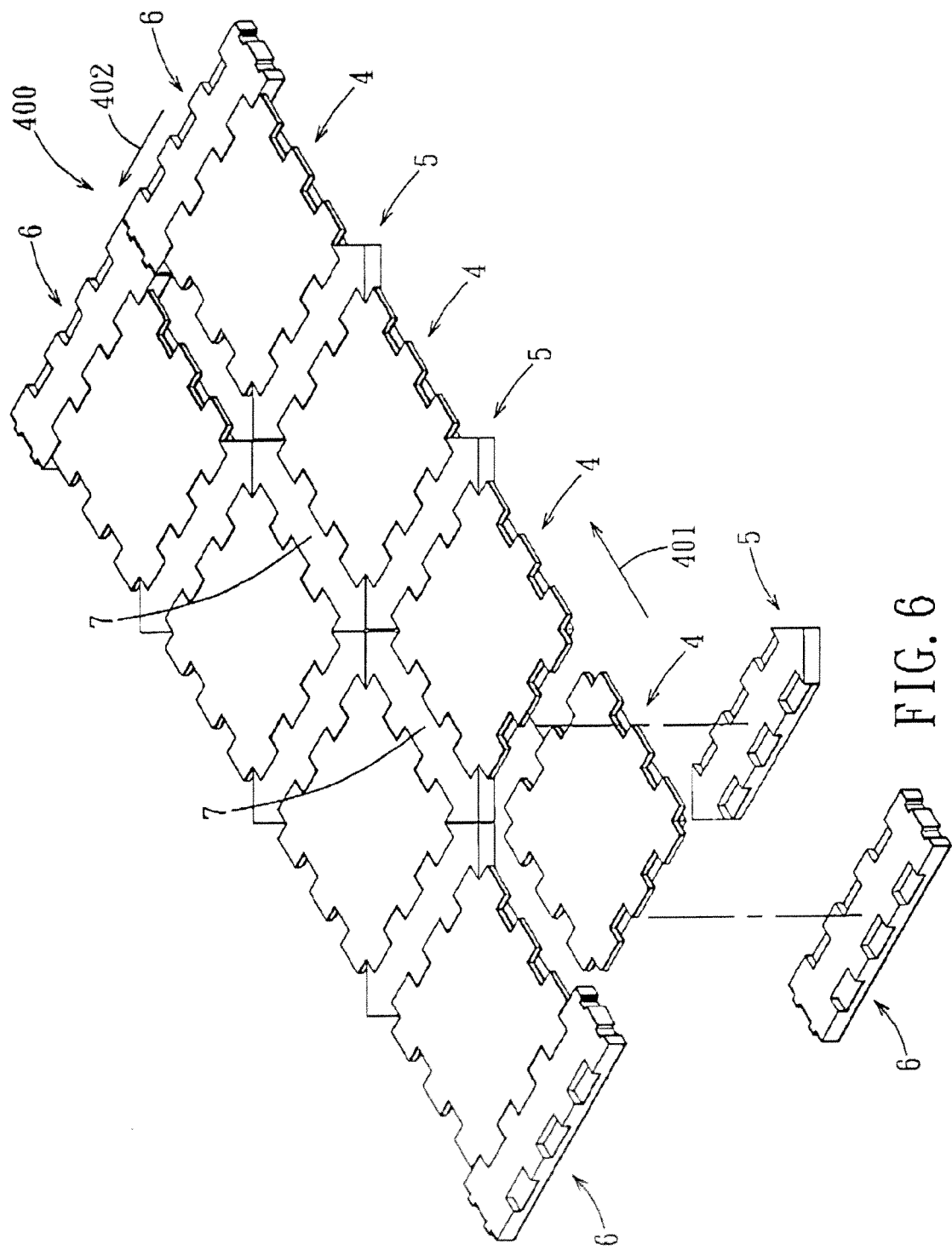
FIG. 6 is a bottom perspective view of FIG. 5.

With reference to FIGS. 5 and 6, in this embodiment, the LED module 400 of the present invention provides a plurality of series-connected LED chips (42a, 42b, 42c). The series connections of the LED chips (42a, 42b, 42c) are achieved by interconnecting a plurality of the LED package units 4 through corresponding connecting units. The connecting units may consist of the second connecting components 6 only, or a combination of the second connecting components 6 and the first connecting components 5.

Figure 7A:
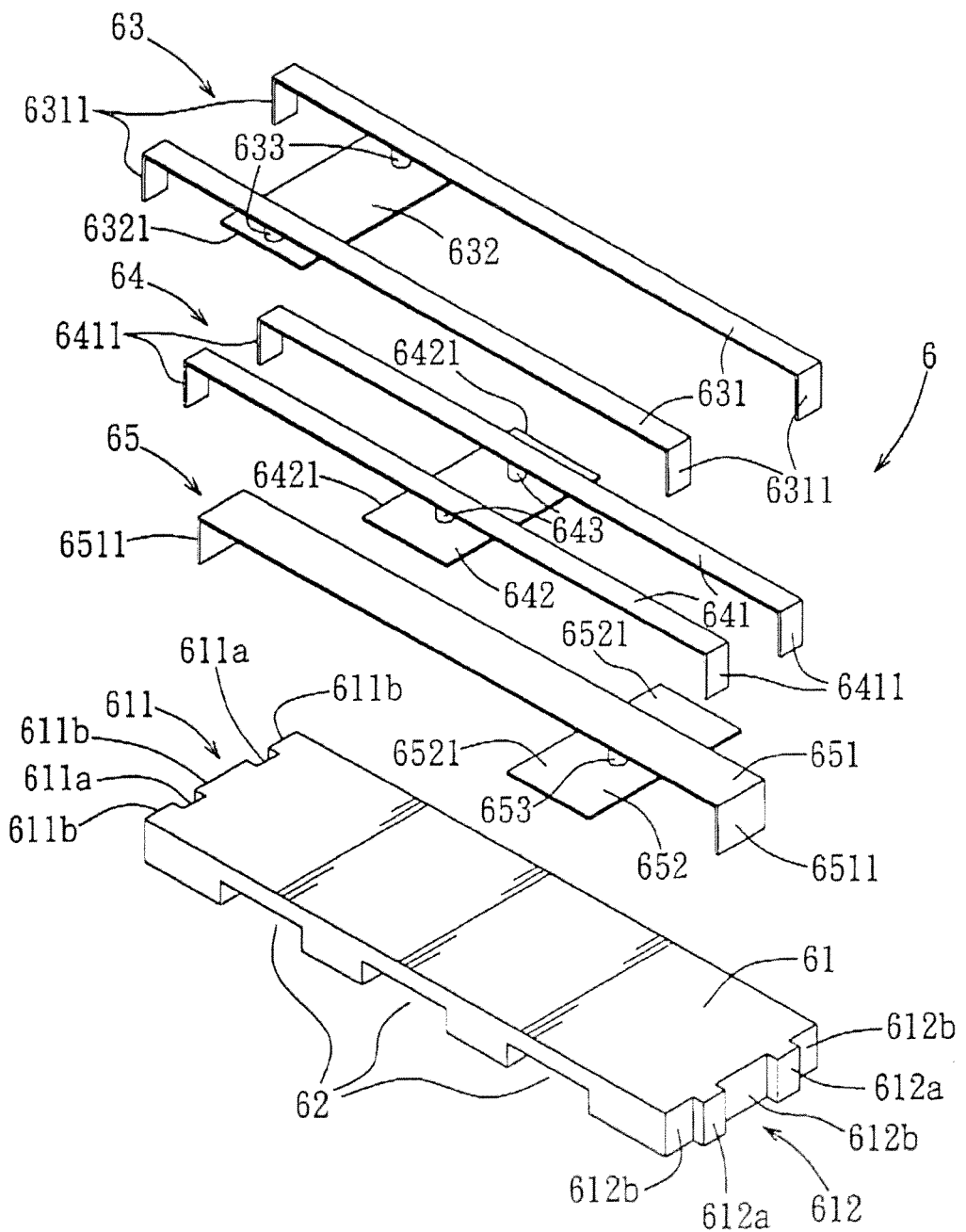
FIG. 7A is an exploded perspective view of the second connecting component.
Figure 7B:
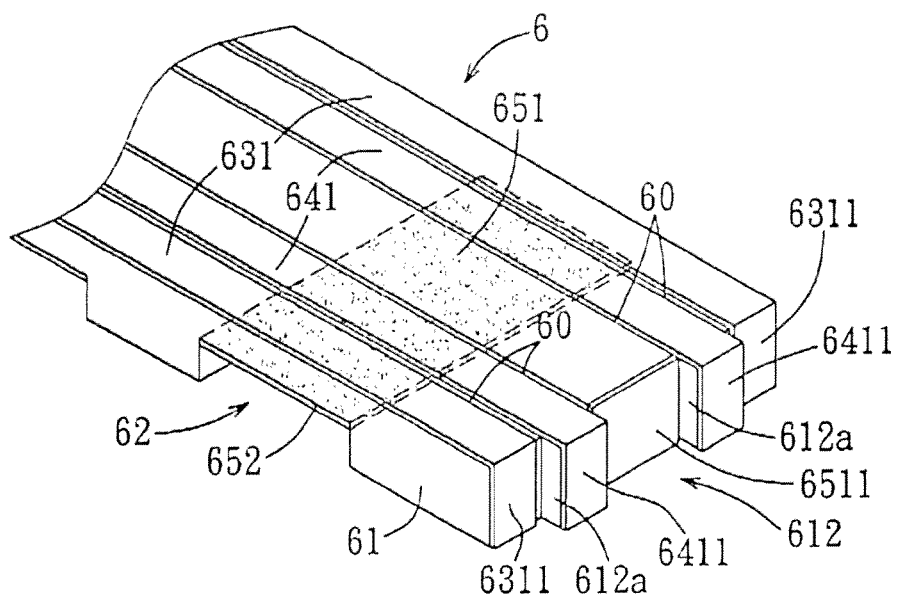
FIG. 7B is a fragmentary perspective view of the second connecting component in an assembled state.
Figure 7C:
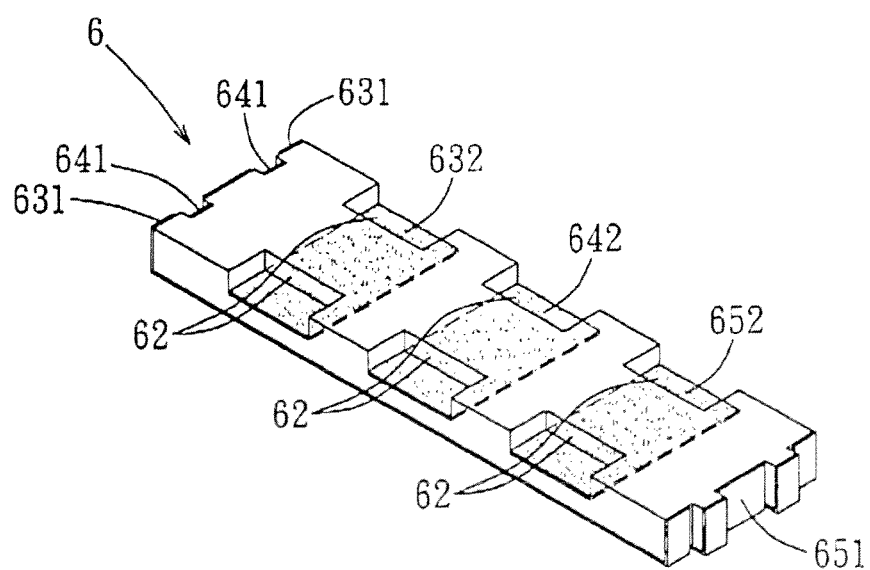
FIG. 7C is a bottom perspective view of the second connecting component in an assembled state.

With reference to FIGS. 7A to 7C, each second connecting component 6 includes the first main body 61, a plurality of pairs of second engaging portions 62 spaced apart from each other and disposed between the first and second connecting ends 611, 612, a plurality of second conductive portions 632, 642, 652, and a plurality of third conductive portions 63, 64, 65 connected with the plurality of second conductive portions 632, 642, 652 respectively and electrically. Each pair of the second engaging portions 62 are configured as grooves that extend inwardly and respectively from the two opposite long sides of the first main body 61. Similarly, the pairs of the second engaging portions 62 of the second connecting component 6 can be engaged respectively to the first engaging portions 43 at one lateral side of one LED package unit 4 and the first engaging portions 43 at one lateral side of another package unit 4.

The second conductive portions 632, 642, 652 of the second connecting component 6 are disposed on the first main body 61 in a manner similar to that described for the second conductive portions 53 of the first connecting component 5. Particularly, two opposite end sections 6321, 6421, 6521 of each second conductive portion 632, 642, 652 are exposed on the bottom face of the first main body 61 via the respective pair of the second engaging portions 62. Further, the second conductive portions 632, 642, 652 of any one second connecting component 6 are electrically isolated from each other.

In this embodiment, the first and second connecting ends 611, 612 of the second connecting component 6 have complementing protuberance-and-recess structures. That is, with reference to FIG. 7A, the first connecting end 611 has three spaced-apart protuberances (611b) projecting from one of the short sides of the first main body 61, and two recesses (611a) each formed between two adjacent ones of the protuberances (611b). The second connecting end 612 has three spaced-apart recesses (612b) aligned respectively with the protuberances (611b) along the lengthwise direction of the first main body 61, and two spaced-apart protuberances (612a) projecting from the other short side of the first main body 61, disposed among the recesses (612b), and aligned respectively with the recesses (611a) along the lengthwise direction of the first main body 61.

With reference to FIG. 5, any one of the second connecting components 6 in one row can be connected to another one of the second connecting components 6 in another one row by gearing the first connecting end 611 of one of the second connecting components 6 into the second connecting end 612 of another one of second connecting component 6.

That is, the two protuberances (612a) on the second connecting end 612 of the first main body 61 of one of the second connecting components 6 are inserted respectively into the recesses (611a) in the first connecting end 611 of the first main body 61 of the other second connecting component 6, so that the second connecting components 6 are interconnected along the second direction 402.

In this embodiment, the third conductive portions 64, 65 are disposed on the top face of the first main body 61, and include one central third conductive portion 65 disposed at the center of the first main body 61, two spaced-apart third conductive portions 64 disposed respectively on two opposite sides of the third conductive portion 65, and two edge spaced-apart third conductive portions 63 disposed adjacent to the third conductive portions 64, respectively, opposite to the third conductive portion 65. Each of the third conductive portions 63, 64, 65 has an elongated conductive body 631, 641, 651 with two opposite bent end sections 6311, 6411, 6511 extending respectively to the recess-and-protuberance structures of the first and second connecting ends 611, 612. That is, the bent end sections 6311, 6411, 6311 of the third conductive portions 63, 64, 65 are respectively exposed on the first and second connecting ends 611, 612 and disposed respectively on the aligning recess (611a, 612b) and protuberance (611b, 612a) of the first main body 61. The conductive bodies 631, 641, 651 of the third conductive portions 63, 64, 65 of any one second connecting component 6 are disposed side-by-side on the top face of the first main body 61 in such a manner that they electrically isolated from each other. The third conductive portions 63, 64, 65 may be formed integrally with the first main body 61 by an insert molding process.

Further, the second conductive portion 632 is connected to bottom faces of the two conductive bodies 631 through two connecting rods 633. The second conductive portions 642 are connected to bottom faces of the conductive bodies 641 through two connecting rods 643. The second conductive portion 652 is connected to a bottom face of the conductive body 651 through a connecting rod 653.

Moreover, the bent end sections 6311 of the conductive bodies 631 and the bent end sections 6511 of the conductive body 651 are located respectively on the protuberances (611b) of the first connecting end 611 and the recesses (612b) in the second connecting end 612 of the first main body 61. The bent end sections 6411 of the conductive bodies 64 are located respectively on the recesses (611a) in the first connecting end 611 and the protuberances (612a) of the second connecting end 612 of the first main body 61. Hence, when two second connecting components 6 are interconnected, through transverse step caused by the recess-and-protuberance structures, the bent end sections 6311, 6411, 6511 of the conductive bodies 631, 641, 651 of one of the second connecting components 6 will be in electrical contact only with the respective bent end sections 6311, 6411, 6511 of the conductive bodies 631, 641, 651 of the other second connecting component 6, especially when the third conductive portions 63, 64, 65 are made from a plurality of metal plates. Further, the conductive body 631, 641, 651 of one of the second connecting components 6 will be electrically isolated from any two adjacent conductive bodies 631, 641, 651 of the other second connecting component 6 excluding the respective con ones.

Additionally, when the third conductive portions 63, 64, 65 are disposed on the first main body 61, a gap or space 60 (see FIG. 73) that extends along the length of the first main body 61 is formed between each two adjacent ones of the third conductive portions 63, 64, 65, so that any two adjacent ones of the third conductive portions 63, 64, 65 are electrically isolated from each other.

Figure 8:
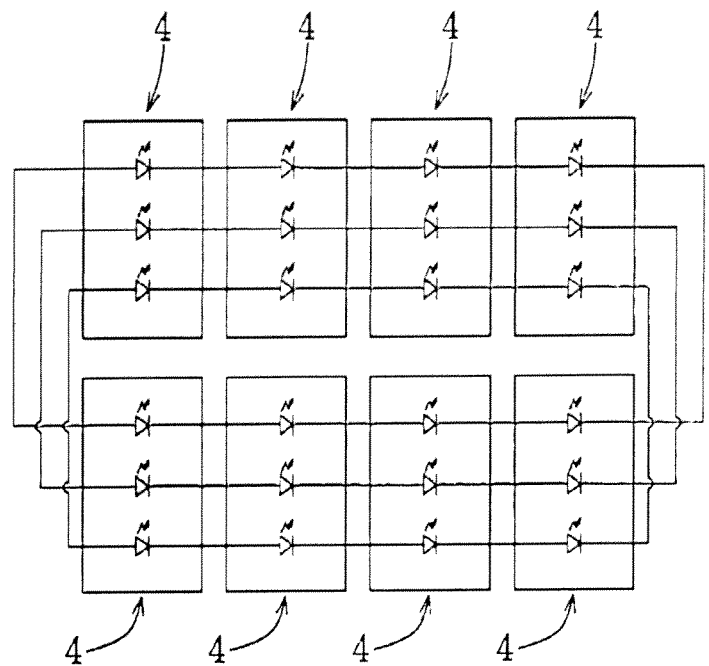
FIG. 8 is a circuit diagram of FIG. 5.

With reference to FIGS. 5, 6, and 7A-C, in this embodiment, the second connecting components 6 are connected to two outermost of each horizontal row of LED package units 4, which are connected through the first connecting components 5, by engaging the second engaging portions 62 with the first engaging portions 43 of two outermost LED package units 4 that are disposed on left and right sides of each horizontal row. Afterwards, by gearing the first connecting end 611 into the second connecting end 612 of the two adjacent horizontal rows of the second connecting components 6, the third conductive portions 63, 64, 65 of the connecting component 6 and the first conductive portions 44 of the LED package units 4 are in electrical contact with each other such that the LED package units 4 can be further connected to each other along the second direction 402 to form an area light source. When the second connecting components 6 are connected to each other, through electrical contacts between the bent end sections 6311, 6411, 6511 of the third conductive portions 63, 64, 65 which are exposed on the first and second connecting ends 611, 612, and the third conductive portions 63, 64, 63 are electrically isolated from each other, as shown in FIG. 8, the two horizontal rows of the LED package units 4, which are connected along the first direction 401, are connected in parallel, and the two horizontal rows of red, blue, and green LED chips (42a, 42b, 42c) are respectively connected in parallel.

Figure 9:
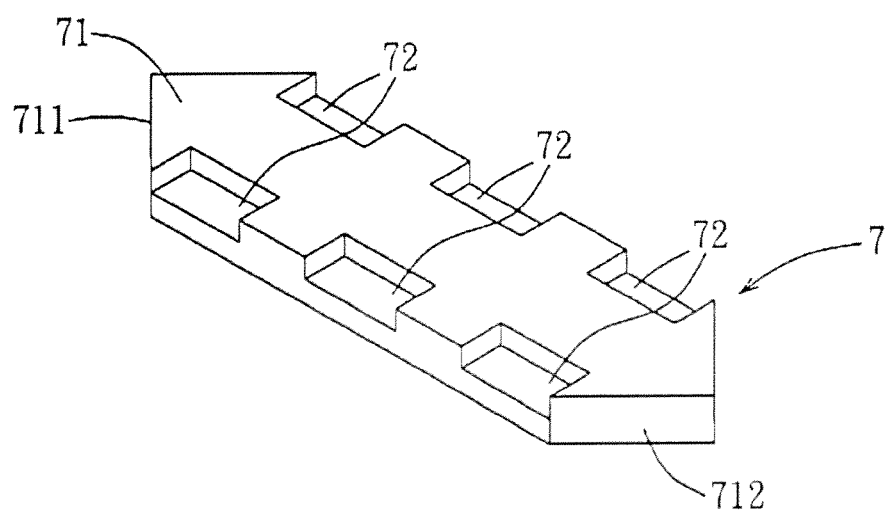
FIG. 9 is a bottom perspective view of a coupling unit of the first preferred embodiment.

With reference to FIG. 9, the LED module 400 of the present invention further comprises a plurality of coupling units 7 each includes a second main body 71, and a plurality of pairs of third engaging portions 72 provided on the second main body 71. The coupling units 7 fix each two rows of the LED package units 4 along the second direction 402 so as to reinforce and stabilize the LED module 400. That is, the third engaging portions 72 of the coupling unit 7 have shapes that complement the shapes of the first engaging portions 43 of the LED package units 4. Further, the third engaging portions 72 of the coupling unit 7 have a structure similar to that of said second engaging portions of the connecting units and are configured as interengageable structures that include complementarily shaped groove and protrusion. In addition, the coupling unit 7 further has a first end, and a second end opposite to said first end and having a structure similar to that of said first end. Preferably, in this embodiment, the structure and shape of the coupling unit 7 are similar to that of the first connecting component 5. Thus, the coupling unit 7 has point-shaped first and second ends 711, 712, but no conductive portions.

Referring again to FIGS. 5 and 6, the coupling units 7 are arranged along the first direction 401, and interconnect each two adjacent LED package units 4 in adjacent two rows so as to reinforce and stabilize the LED module 400. More specifically, each two LED package units 4 in the adjacent two rows are interconnected by engaging respectively the third engaging portions 72 at the long sides of one of the coupling units 7 with the first engaging portions 43 at one lateral side of one LED package unit 4 in on and the first engaging portions 43 at one lateral side of the adjacent one LED package unit 4 in another one row. Since the coupling unit 7 has no conductive portions, there is no electrical contact between the two adjacent LED package units 4 interconnected by the coupling unit 7.

Further, the LED module 400 has various combinations of the LED package units 4 and the connection units depending on the electrical circuit design requirements about the LED chips (42a, 42b, 42c). For example, the first connecting component 5 between any two adjacent ones of the LED package units 4 may be replaced by the second connecting component 6. Alternatively, the LED package units 4 in each row may be interconnected by a combination of the first connecting components 5 and the second connecting components 6. For example, any two LED package units 4 may be interconnected using the first connecting component 5, and another two of the LED package units 4 may be interconnected using the second connecting component 6. That is, with such a configuration, at least one LED package unit 4 is disposed between the first and second connecting components 5, 6. In this case, in each row of the LED package units 4, the LED chips (42a, 42b, 42c) of the two adjacent LED package units 4, which are interconnected by the first connecting component 5, are connected respectively in series, and the LED chins (42a, 42b, 42c) of the two adjacent LED package units 4, which are interconnected by the first connecting component 6, are also connected respectively in series. The two rows of the LED package units 4 are then interconnected through engagement of the first connecting components 6 along the second direction 402, so that the LED chips (42a, 42b, 42c) of two adjacent LED package units 4 are respectively connected in parallel.

Figure 10:
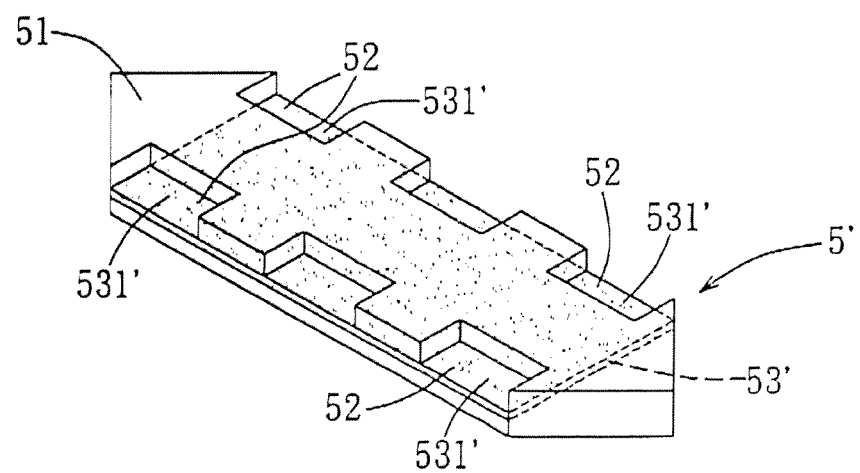
FIG. 10 is a bottom perspective view of an alternative form of the first connecting component.
Figure 11:
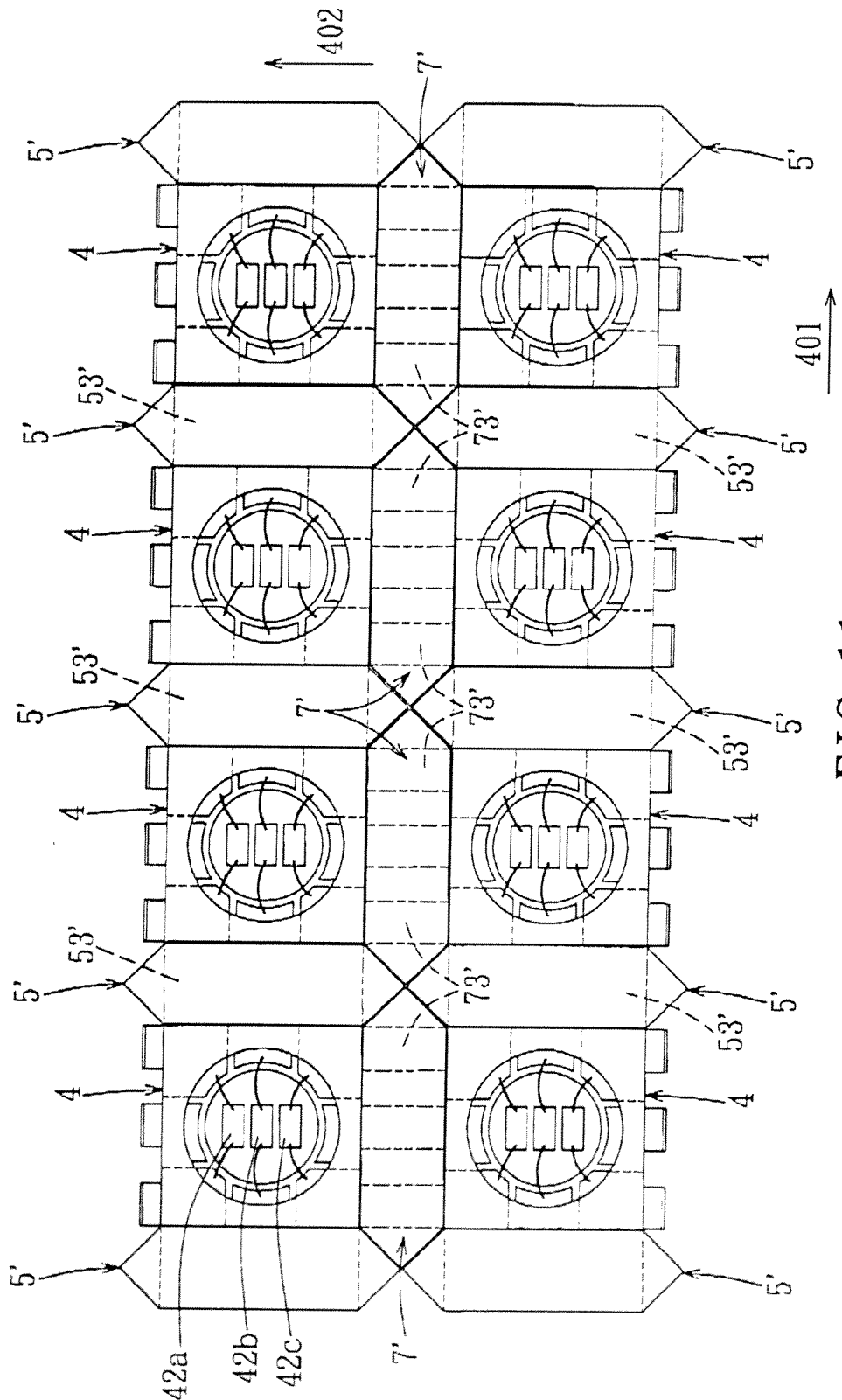
FIG. 11 is a schematic top view, illustrating how the LED package units can be interconnected by using a plurality of the first connecting component shown in FIG. 10 and a plurality of the first connecting components shown in FIG. 4 to form an area light source.

FIGS. 10 and 11 illustrate an alternative form of the first connecting component 5' of the connecting unit. The difference between the first connecting component 5' and the first connecting component 5 shown in FIG. 4 resides in that the first connecting component 5' includes only one second conductive portion 53'. The second conductive portion 53' may be similarly formed by insert molding, may be a movable metal body embedded in the first main body 51, or may be formed by stack sintering so as to form a one-piece body with the first main body 51. The second conductive portion 53' has a plurality of end sections 531' exposed via the second engaging portions 52. Further, in this embodiment, each coupling unit 7' further has a plurality of conductive portions 73'.

Figure 12:
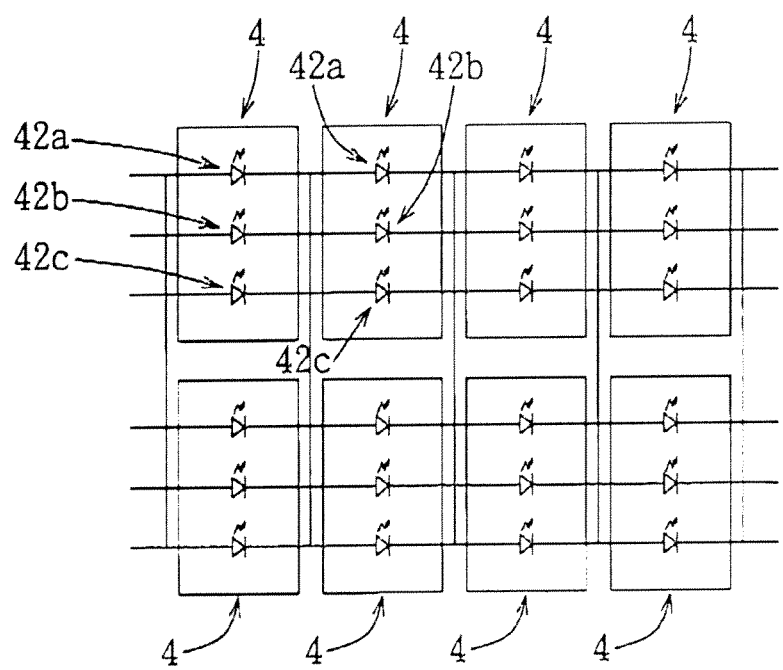
FIG. 12 is a circuit diagram of FIG. 11.

Hence, when a plurality of the LED package units 4 are interconnected by a plurality of the first connecting components 5' along the first direction 401 to form row, the LED package units 4 are connected in series, and the LED chips (42a, 42b, 42c) are connected electrically to each other. Afterwards, two rows of the LED package units 4 interconnected by the coupling units 7' to extend along the second direction 402, so that the LED chips (42a, 42b, 42c) of the two rows of the LED package units 4 can be connected electrically to each other through electrical contacts of the conductive portions 73' with the first conductive portions 44 of the LED package units 4. Hence, the LED chips (42a, 42b, 42c) can be connected electrically to each other in series and in parallel, as shown in FIG. 12.

Therefore, any two LED package units 4 in any two adjacent rows may be interconnected by the coupling unit 7' to extend along the second direction 402, so that at least one LED chip (42a) of one of the LED package units 4 in one row and at least one LED chip (42c) of another LED package unit 4 in another one row are connected electrically to each other through a circuit formed by the first conductive portions 44 of the two LED package units 4 and a circuit formed by the conductive portions 73 of the coupling unit 7'. A plurality of the first connecting components can further interconnect the two LED package units 4 along the first direction 401, so that the LED chips (42a, 42b, 42c) of the LED package units 4 can be connected electrically in parallel.

In addition, the first and second ends 711, 712 of the second main body 71 of the coupling unit 7, 7' have structures complementary to the first and second ends 511, 512 of the first main body 51 of the first connecting components 5, 5' so as to provide a flat surface in an area defined by two adjacent first main bodies 51 and two adjacent second main bodies 71. With reference to FIGS. 5 and 11, since the first and second ends 711, 712 of the coupling unit 7, 7' and the first and second ends 511, 512 of the first connecting component 5,5', are pointed, when the LED package units 4 are interconnected through the coupling unit 7, 7' and the first connecting components 5,5', the coupling unit 7, 7' and the first connecting components 5' are flush at a junction and can thus form a flat surface.

Figure 13:
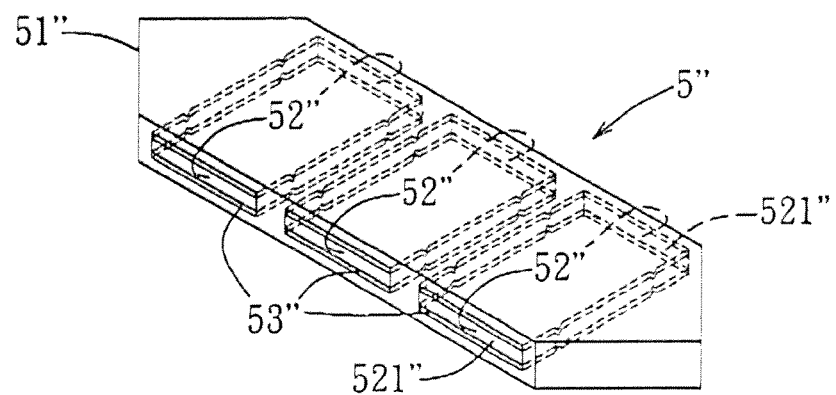
FIG. 13 is a perspective view of another alternative form of the first connecting component.
Figure 14:
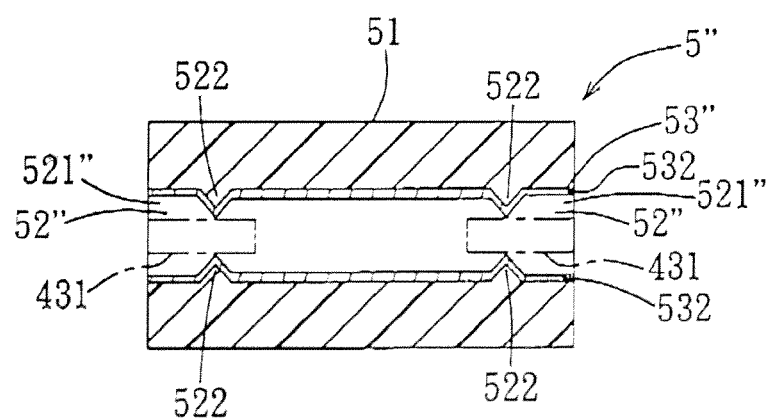
FIG. 14 is a sectional view of the first connecting component of FIG. 13.

FIGS. 13 and 14 illustrate another alternative form of the first connecting component 5" of the connecting unit. Each pair of the second engaging portions 52" disposed between the top and bottom faces of the first main body 51" of the first connecting component 5" are configured as engaging grooves 521" that extend inwardly and respectively from the long opposite lateral sides of the first main body 51" without extending through the top or bottom face of the first main body 51". The pair of the engaging grooves 521" can communicate with each other or not. Each second conductive portion 53" is composed of at least one of upper and lower conductive layers 532 provided respectively on upper and lower interior wall of the pair of the engaging grooves 521". That is, each of the upper and lower conductive layers 532 extends from the upper or lower interior wall of one of the pair of the engaging grooves 521" to the upper or lower interior wall of the other one of the pair of the engaging grooves 521". The forming method of the conductive layers 532 may be similar to that described for the second conductive portion 53. As shown in FIG. 14, which illustrates a sectional view of the first connecting component 5", the structure of an upper portion of the first main body 51" attached with the upper conductive layer 332 and the structure of a lower portion of the first main body 51" attached with the lower conductive layer 32 are mirror images of each ether.

Each of the pair of the second engaging portions 52" is provided with a retaining structure, in the form of protrusions 522 that project respectively toward each other from the upper and lower interior opposite sidewalls or left and right interior opposite sidewalls of a corresponding one of the engaging grooves 521" and that have pointed ends so as to be firmly connected with the LED package units 4 and the connecting unit. In this embodiment, the protrusions 431 of the first engaging portions 43 of the LED package units 4 are conductive or conductive material above thereof such as the first conductive portion 44. Hence, when the first engaging portions 43 of two adjacent ones of the LED package units are inserted into the engaging grooves 521" in the long sides of the first main body 51", the protrusions 522 can clamp fixedly the first engaging portions 43 of the LED package units 4, and the first conductive portions 44 can contact electrically the conductive layers 532 to form electrical connections between the LED package units 4.

The retaining structure, aforesaid protrusions 522 of the second engaging portions 52" may also be applied to the connection unit, such as the first connecting component 5, 5' these second connecting component 6, or the coupling unit 7, 7'. Using FIG. 4 as an example, since the grooves 521 of the first engaging portions 52 are formed in the bottom face of the first main body 51, the protrusions 522 may be provided on two opposite interior sidewalls of each groove 521 so as to clamp therebetween the protrusion 431 of each first engaging portion 43 to avoid looseness between the LED package units 4 and the connecting unit.

In addition, the first engaging portions 43 of the LED package unit 4 may be formed with structures similar to that of the retaining structures of the second engaging portions 52", and/or cooperate with the first conductive portions 44 which may be formed with structures corresponding to the structures of the first engaging portions 43. The retaining structures of the protrusion 431 of the first engaging portions 43 projects from the opposite lateral sides of the protrusion 431 of the first engaging portion 43 so as clamp the second engaging portions of the connecting unit and the corresponding first engaging portions 43 of the LED package units 4. Any engaging method can be made depending on the requirements.

Moreover, the first engaging portion 43 may further be formed with a retaining structure not shown) that corresponds to the retaining structure of the second engaging portion 52". For example, if the retaining structure of the second engaging portion 52" is configured as protrusions 522, the retaining structure of the first engaging portion 43 is configured as grooves; and if the retaining structure of the second engaging portion 52" is configured as grooves, the retaining structure of the first engaging portion 43 is configured as protrusions. Hence, the retaining structures of the second engaging portion 52" and the first engaging portion 43 may be configured as interengageable structures composed of complementarily shaped groove and protrusion.

Figure 15:
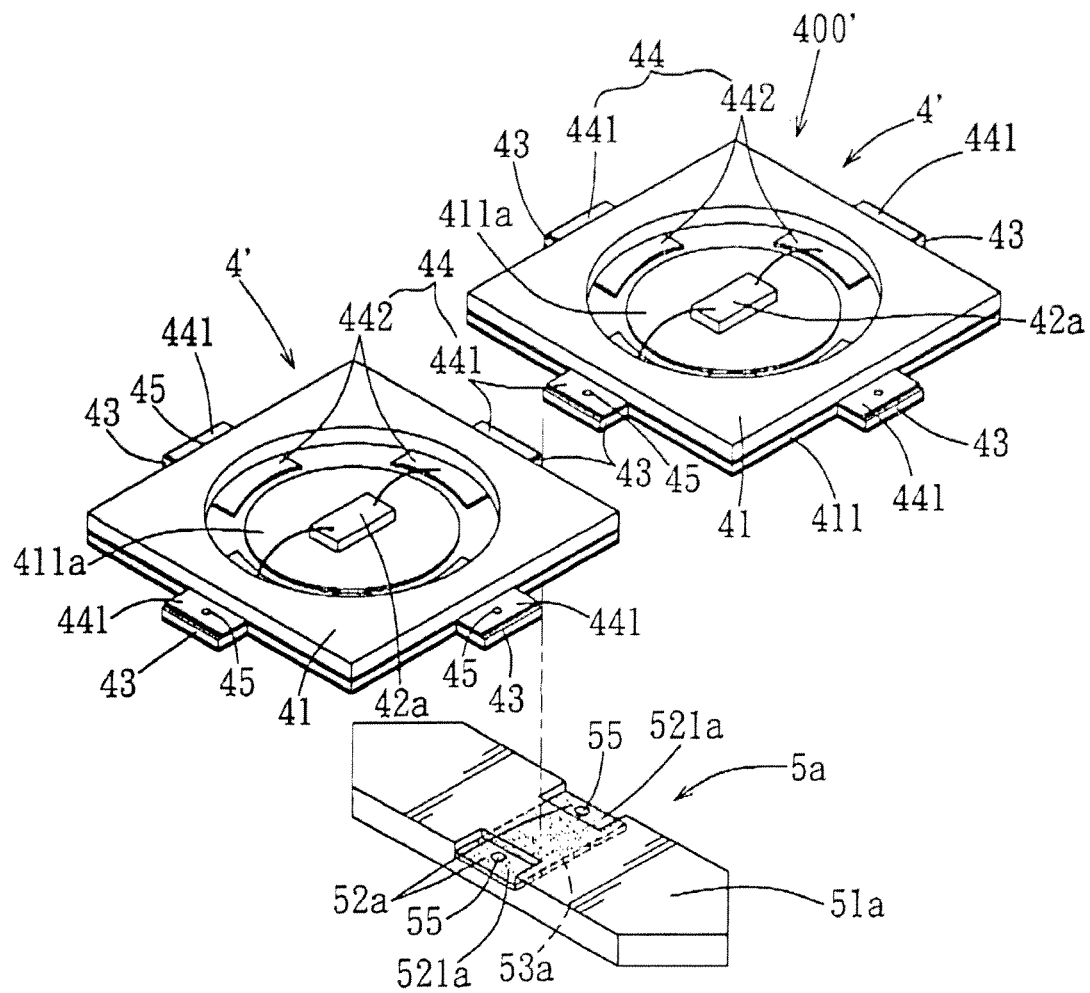
FIG. 15 is an exploded perspective view of an LED module according to the second preferred embodiment of the present invention.

Referring to FIG. 15, an LED module 400' according to the second preferred embodiment of the present invention is shown to be similar to the first referred embodiment. In this embodiment, the LED module 400' comprises two LED package units 4' and a connecting unit. Each LED package unit 4' includes a LED chip (42a) fixed on the chip-mounting area (411a), a plurality of first engaging portions 43 that are spaced apart from each other, each projected outwardly from a respective lateral side of the bottom layer 411 of the submount 41, and a plurality of first conductive portions 44 provided on the submount 41 and each having one end section 441 extending to the respective first engaging portion 43 so as to be exposed therefrom, and another end section 442 extending toward the chip-mounting area (411a) for electrical connection with the LED chip (42a).

Figure 16:
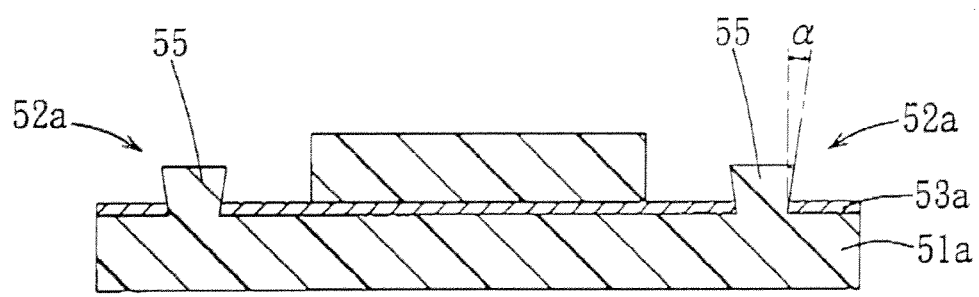
FIG. 16 is a sectional view of a first connecting component the second preferred embodiment.

The connecting unit is configured as a first connecting component (5a) which includes a first main body (51a), two second engaging portions (52a) provided respectively on the left and right long sides of the first main body (51a), and a second conductive portion (53a) provided on the first main body (51a). An appearance of the first main body (51a) may be similar to that of the first main body 51 in the first preferred embodiment, especially on top face of the first main body. The disposition of the second conductive portion (53a) on the first main body (51a) is similar to that described for the second conductive portion 53 of the first connecting component 5 in the first preferred embodiment. Further, each first engaging portion 43 of each LED package unit 4' may be provided with a first retaining structure, for example, an engaging hole 45. The engaging hole 45 extends through the first conductive portion 44. Each second engaging portion 52 of the first connecting component (5a) may be provided with a second retaining structure to engage with the first retaining structure, for example, a stud 55. Hence, the first and second retaining structures may be configured as interengageable structures composed of complementarily shaped stud and hole. When one of the second engaging portions 52 is connected to the first engaging portion 43 at one lateral side of one LED package unit 4, the stud 55 is engaged to the engaging hole 45 so as to further stabilize connection between the LED package unit 4 and the first connecting component (5a). Preferably, the structure of the stud 55 is dovetailed, as shown in FIG. 16. The stud 55 gradually diverges from the first main body (51a) into the respective groove (521a). A diverging angle ($\alpha$) of the stud 55 relative to a vertical reference line is preferably 5°-8°. However, an angular range of 1°-10° is also acceptable.

From the aforesaid description, it is apparent that, in this invention, each LED package unit 4, 4' is provided with the engaging portions 43 to engage with the engaging portions 52, 52', 52", (52a) of the corresponding connecting units 5, 5', 5", 5a, 6, and the conductive portions 44 for electrical connection with the conductive portions 53, 53a, 632, 642, 652 of the corresponding connecting units 5, 5', 5", 5a, 6, so that in addition to achieving the structural mosaicking of the LED package units 4, 4' using the connecting units 5, 5', 5", 5a, 6 to permit the user to assemble a light source of different dimensions according to his/her requirements, the LED chips of the LED package units can also be coupled electrically to each other through the connecting units 5, 5', 5", 5a, 6. Hence, the present invention has a high flexibility in varying the area of the area light source, and can achieve the object of the present invention.

While the present invention has been described in connection with what are considered the most practical and preferred embodiments, it is understood that this invention is not limited to the disclosed embodiments but is intended to cover various arrangements included within the spirit and scope of the broadest interpretations and equivalent arrangements.

We claim:

1. A reconfigurable LED module system, comprising:
   a plurality of LED package units each having a submount;
   a plurality of first engaging portions and a plurality of first conductive portions disposed on said submount;
   at least one LED chip positioned on said submount, said submount of each of said LED package units being a multilayer structure and including a top layer and a bottom layer;
   a top surface of said bottom layer being provided with a chip-mounting area for mounting of said LED chip thereon, said top layer being disposed above said bottom layer and having a cavity for exposure of said LED chip which is mounted on said chip-mounting area, said first conductive portions being provided on said top surface of said bottom layer, being spaced apart from each other, surrounding said chip-mounting area, at least two of said first conductive portions being exposed via said cavity for electrical connection with said LED chip, each of said first conductive portions having at least one portion connected to a corresponding one of said first engaging portions; and
   at least one connecting unit having a first main body, at least two second engaging portions disposed on said first main body, and at least one second conductive portion having two opposite end sections extending respectively to said second engaging portions;
   wherein said second engaging portions engage with corresponding ones of said first engaging portions of two of said LED package units, and said two end sections of said second conductive portion of said connecting unit contact corresponding ones of said first conductive portions of said two LED package units so that said LED package units can be interconnected through said connecting unit and said LED chips of said LED package units can be electrically connected.

2. The reconfigurable LED module system of claim 1, wherein each of said first engaging portions and a corresponding one of said second engaging portions are configured as interengageable structures that include complementarily shaped groove and protrusion.

3. The reconfigurable LED module system of claim 2, wherein each of said first engaging portions of each of said LED package units is configured as a protrusion projecting outwardly from a lateral side of said submount, said second engaging portions of said connecting unit being configured as grooves that extend inwardly and respectively from two opposite lateral sides of said first main body, said end sections of said second conductive portion of said connecting unit being exposed through said corresponding grooves, respectively.

4. The reconfigurable LED module system of claim 1, wherein each of said second engaging portions of said connecting unit has two opposite interior sidewalls formed correspondingly with protrusions to clamp therebetween a corresponding one of said first engaging portions of said LED package unit.

5. The reconfigurable LED module system of claim 1, wherein each of said first engaging portions is provided with a first retaining structure, and each of said second engaging portions is provided with a second retaining structure, said first retaining structure and said second retaining structure being configured as interengageable structures composed of complementarily shaped stud and hole or complementarily shaped groove and protrusion.

6. The reconfigurable LED module system of claim 1, wherein said submount of each of said LED package units further includes a heat-dissipating layer provided on a bottom face of said bottom layer.

7. The reconfigurable LED module system of claim 1, wherein said first main body of said connecting unit has a first end, and a second end opposite to said first end and having a structure similar or complementary to that of said first end.

8. The reconfigurable LED module system of claim 7, wherein said LED module comprises a plurality of said connecting units, some of said connecting units further comprise at least one third conductive portion disposed on said first main body thereof and two opposite end sections extending respectively to said first and second ends, said third conductive portion being connected electrically to said second conductive portion, when said first end of one of said connecting units is connected to said second end of another one of said connecting units, said third conductive portions of said connecting units and said first conductive portions of said LED package units are in electrical contact with each other.

9. The reconfigurable LED module system of claim 8, wherein said first and second ends of some of said connecting units are respectively formed with a plurality of recesses and a plurality of protuberances, each of said recesses being aligned with one of said protuberances along the lengthwise direction of said first main body of a corresponding one of said connecting units, said end sections of any one of said third conductive portions being disposed respectively on one of said recesses and the respective said protuberance.

\* \* \* \* \*